(12) United States Patent
Rives et al.

(10) Patent No.: US 6,845,280 B1
(45) Date of Patent: Jan. 18, 2005

(54) WORK IN PROGRESS MANAGEMENT PROGRAM INTERFACE

(75) Inventors: Noel Curtis Rives, Austin, TX (US); Donald Craig Likes, Austin, TX (US); Carmen Adriana Maxim, Austin, TX (US); Marwane Jawad Yazback, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/305,470

(22) Filed: Nov. 26, 2002

(51) Int. Cl.[7] .............................................. G06F 19/00
(52) U.S. Cl. ....................... 700/121; 700/108; 700/109
(58) Field of Search .......................... 700/83, 108, 109, 700/110, 121; 707/1; 716/1; 345/866

(56) References Cited

U.S. PATENT DOCUMENTS

| | | | |
|---|---|---|---|
| 5,889,674 A | 3/1999 | Burdick et al. | 364/468.28 |
| 6,233,719 B1 * | 5/2001 | Hardikar et al. | 716/1 |
| 6,366,824 B1 | 4/2002 | Nair et al. | 700/115 |
| 6,463,447 B2 * | 10/2002 | Marks et al. | 715/513 |
| 2002/0055886 A1 * | 5/2002 | Hinckley | 705/26 |

OTHER PUBLICATIONS

Tibco "Tibco Business Works" Tibco Data Sheet, Technology. 2002.
Tibco "Tibco Portal Solutions" Tibco Data Sheet, Technology 2002.
Tibco "Tibco Messaging Solutions" Tibco Data Sheet, Technology 2002.
http://www.brooks–pri.com/html/352_apf_real_time_dispatcher.cfm?outputtype=print, Brooks–Pri Automation, Inc APF Real Time Dispatcher, Nov. 11, 2002.
Triniti, Architects of the Virtual Enterprise "Enabling Business Solutions Across the Supply–Chain" 2000.

* cited by examiner

*Primary Examiner*—Leo Picard
*Assistant Examiner*—Charles Kasenge
(74) *Attorney, Agent, or Firm*—Hamilton & Terrile, LLP; Stephen A. Terrile

(57) ABSTRACT

An interface for a semiconductor fabrication facility which includes a real time dispatch system providing near real time information regarding processing of semiconductor wafers and a middleware component. The interface includes a work in progress application program interface coupled between the fabrication facility and the middleware component. The work in progress application program interface provides a common interface for communicating between the fabrication facility and the middleware component.

24 Claims, 14 Drawing Sheets

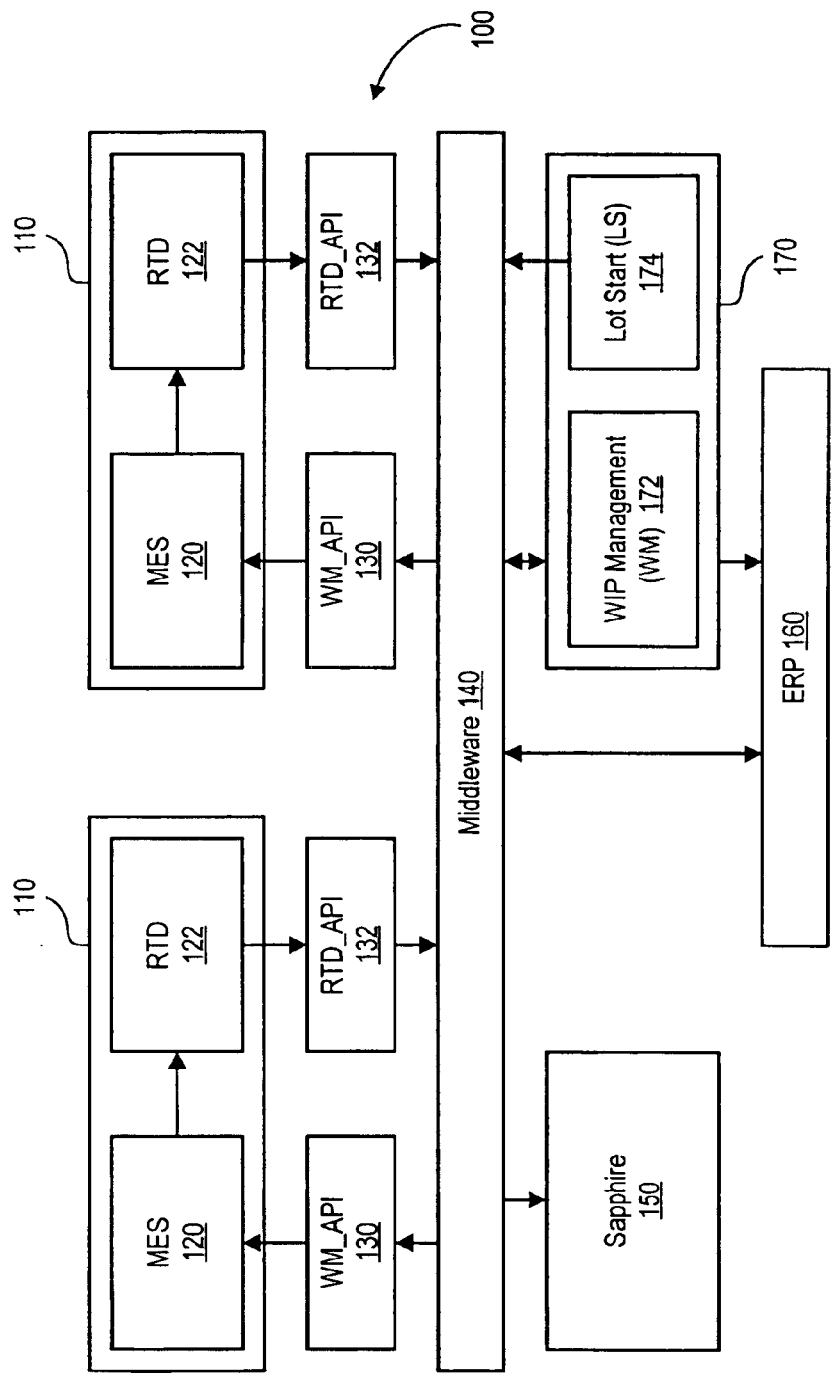

WORK IN PROGRESS MANAGEMENT PROGRAM INTERFACE

BACKGROUND OF THE INVENTION

1. Field of the Invention

The present invention relates to semiconductor manufacturing and more particularly to a work in progress management program interface.

2. Description of the Related Art

Manufacturing semiconductor devices uses a plurality of discrete process steps to create a semiconductor circuit from raw semiconductor material. The discrete process steps, from the initial melt and refinement of the semiconductor material, the slicing of the semiconductor crystal into individual wafers, the fabrication stages (e.g., etching, doping, ion implanting or the like), to the packaging and final testing of the completed device may be performed in different facilities in remote regions of the globe.

One issue which arises in semiconductor manufacturing is that the various processes which may take place at discrete locations may make it difficult to track a semiconductor device through the fabrication process. Such tracking may be desirable for quality control as well as inventory management.

In known semiconductor fabrication facilities, individual fabrication machines may provide and receive data regarding operating conditions during the fabrication process in many different data formats. Some of the data that is provided and received by the fabrication machines includes intrinsic data such as, for example, lot numbers, device model number or the like as well as extrinsic data such as production test data, production conditions or the like.

SUMMARY OF THE INVENTION

In one embodiment, the invention relates to an interface for a semiconductor fabrication facility which includes a real time dispatch system providing near real time information regarding processing of semiconductor wafers and a middleware component. The interface includes a work in progress application program interface coupled between the fabrication facility and the middleware component. The work in progress application program interface provides a common interface for communicating between the fabrication facility and the middleware component.

In another embodiment, the invention relates to a method for interfacing between a fabrication facility and a middleware component which includes providing a work in progress application program interface coupled between the fabrication facility and the middleware component, publishing information from the fabrication facility to the middleware component via the work in progress application program interface, and subscribing to information from the middleware component via the work in progress application program interface. The work in progress application program interface provides a common interface for communicating between the fabrication facility and the middleware component.

In another embodiment, the invention relates to a computer readable media encoded with an application for providing an interface for a semiconductor fabrication facility including a real time dispatch system providing near real time information regarding processing of semiconductor wafers and a middleware component. The application includes a work in progress application program interface module coupled between the fabrication facility and the middleware component. The work in progress application program interface module provides a common interface for communicating between the fabrication facility and the middleware component.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 1 shows a block diagram of a semiconductor fabrication architecture including ERP integration.

DETAILED DESCRIPTION

Figure 2A:
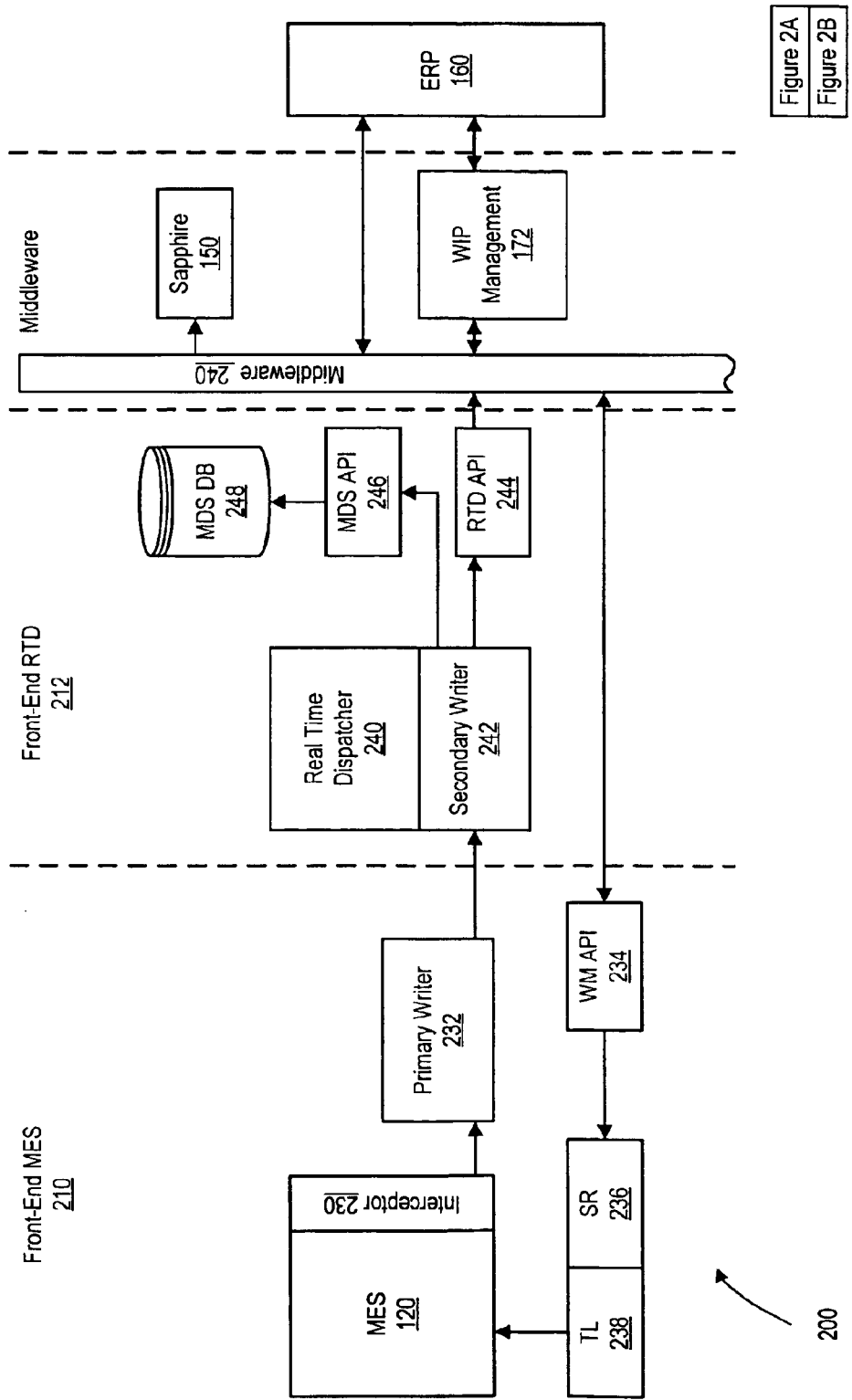
FIGS. 2A and 2B show a more detailed block diagram of the semiconductor fabrication architecture of FIG. 1.

Referring to FIG. 1, a block diagram of a semiconductor fabrication architecture 100 is shown. More specifically, the front end fabrication architecture 100 includes a plurality of individual fabrication locations 110, which may be distributed across various at remote manufacturing facilities. Each individual fabrication facility 110 represents a black box within the architecture 100. I.e., providing data to and receiving data from the fabrication facility 110 is in a format which is common to the architecture 100 whether or not this format is understood by an individual fabrication facility 110 or machines within the individual fabrication facility 110.

Each individual fabrication facility 110 includes a manufacturing execution system (MES) 120 for tracking the overall processing of semiconductor wafers as well as a Real Time Dispatch (RTD) system 122 for providing near real time information regarding the processing of the semiconductor wafers. The MES may be, for example, a manufacturing execution system such as Workstream available from Applied Materials. The real time dispatch system 122 executes at the factories at an execution level. An APF/RTD real time dispatch system available from Brooks Automation is an example of one known RTD system 122.

Each individual fabrication facility 110 includes a respective work in progress (WIP) management application program interface (API) 130 as well as a real time dispatch (RTD) application program interface (API) 132. The WM API 130 provides a common interface with which to communicate with each individual fabrication facility 110. The RTD API 132 provides a common interface from which to receive information from each individual fabrication facility 110.

The RTD API 132 performs a plurality of functions. More specifically, the RTD API 132 publishes lot data (WIPLOT) to the middleware component 140. The RTD API 132 publishes lot history data (WIPLTI) to the middleware component 140. The RTD API 132 publishes lot attribute data (WIPLTA) to the middleware component. The RTD API 132 is a client of the real time dispatcher 122. The RTD API 132 publishes MES data to the message bus 140. The MES data that is published includes lot data, lot history data and lot attribute data.

The WM API 130 performs a plurality of functions. More specifically, the WM API 130 interfaces with the XML communicator of the middleware component 140. The WM API 130 subscribes to route update information. The WM API 130 packages and publishes route operations based on a trigger. The WM API 130 subscribes to ship transactions. The WM API 130 packages and publishes wafer IDs associated with ship transactions. The WM API 130 creates lot information.

The individual fabrication facilities 110 communicate with each other via a middleware component 140. One example of such a middleware component is the TIBCO Rendezvous System available from TIBCO Software, Inc. The middleware component 140 performs a plurality of functions. More specifically, the middleware component 140 provides an interface subscriber function. The middleware component 140 provides an interface publisher component The middleware component 140 implements certified messages. The middleware component 140 transfers messages in an XML message format.

A SAPPHiRE (Systematic Approach to Product Performance History and REliability Engineering) system 150 is also coupled to the middleware component 140. The SAPPHiRE system 150 may be located remotely from one or more of the individual fabrication facilities.

An enterprise resource planning system 160 is also coupled to the middleware component 140. One example of an enterprise resource planning system is the ERP R/3 system available from SAP. The enterprise resource planning system 160 may be located remotely from one or more of the individual fabrication facilities as well as from the SAPPHiRE system 150. SAPPHiRE system 150 includes a database that collects engineering data and allows users to perform yields and engineering analysis. The SAPPHiRE system 150 also allows a user to trace product failures.

An inventory management system 170 is also coupled to the middleware component 140. The inventory management system 170 includes a WIP management (WM) component 172 as well as a Lot Start component 174. One example of an inventory management system is available from Triniti Corporation. The inventory management system 170 provides a centralized lot database for global visibility into all WIP moves. The inventory management system also provides the following functions: real time integration of items between the ERP system 160, MES 120, and other systems; real time integration of Bill of Materials in the ERP system 160, MES 120, and other systems; real time integration of Routes from the ERP system 160 to the MES system 120 for Back-end facilities; real time integration of Routes from the MES system 120 to the ERP system 160 for Front-end facilities; real time access to all relevant MES lot Transactions; the ability to make ERP system BOM levels transparent to MES systems 120; real time updates to the ERP system 160 regarding costing data and inventory valuations, and a global real time view of inventory in the ERP system 160 and WIP in MES systems120. The inventory management system 170 may be located remotely from one or more of the individual fabrication facilities as well as from the SAPPHiRE system 150 and the enterprise resource planning system 160.

The WM component 172 provides a global view of WIP as well as static inventory. The WM component 172 also enables fallout fixing by matching WIP and inventory locations to physical lot locations. The WM component 172 is the system of record for all lot history, lot attribute and route/operation transactions performed and provides the capability to trace forward and backward from raw wafer to sort/die out. The lot start component 174 provides lot start information relating to all WIP.

By providing the WM API 130 and the RTD API 132 each of the components within the architecture 100 may communicate using a common language in near real time. I.e., when a transaction is performed, information relating to the performance of the transaction is communicated to the other systems within the semiconductor fabrication architecture 100 as soon as the transaction occurs (there is no need for running another set of programs on a source system to obtain and transmit the data from the source system).

Information from the MES 120 is interfaced to the database of the ERP system 160 via the WM component 172. The MES 120 sends all lot history, lot attribute and route operation information to the WM component 172. The WM component 172 filters, formats and forwards the data to the database of the ERP system 160. Thus, the database of the ERP system 160 reflects a subset of all MES activities implemented by the various modules of the individual fabrication facility 110.

The WM API 130 subscribes to messages published by the RTD API 132 and by the WM component 172 and publishes messages back to the WM component 172. The RTD API 132 is an RTD client that publishes MES data to the middleware component 140. All lot, lot history, lot attribute, route and operation data is published via the RTD API 132.

Figure 2B:
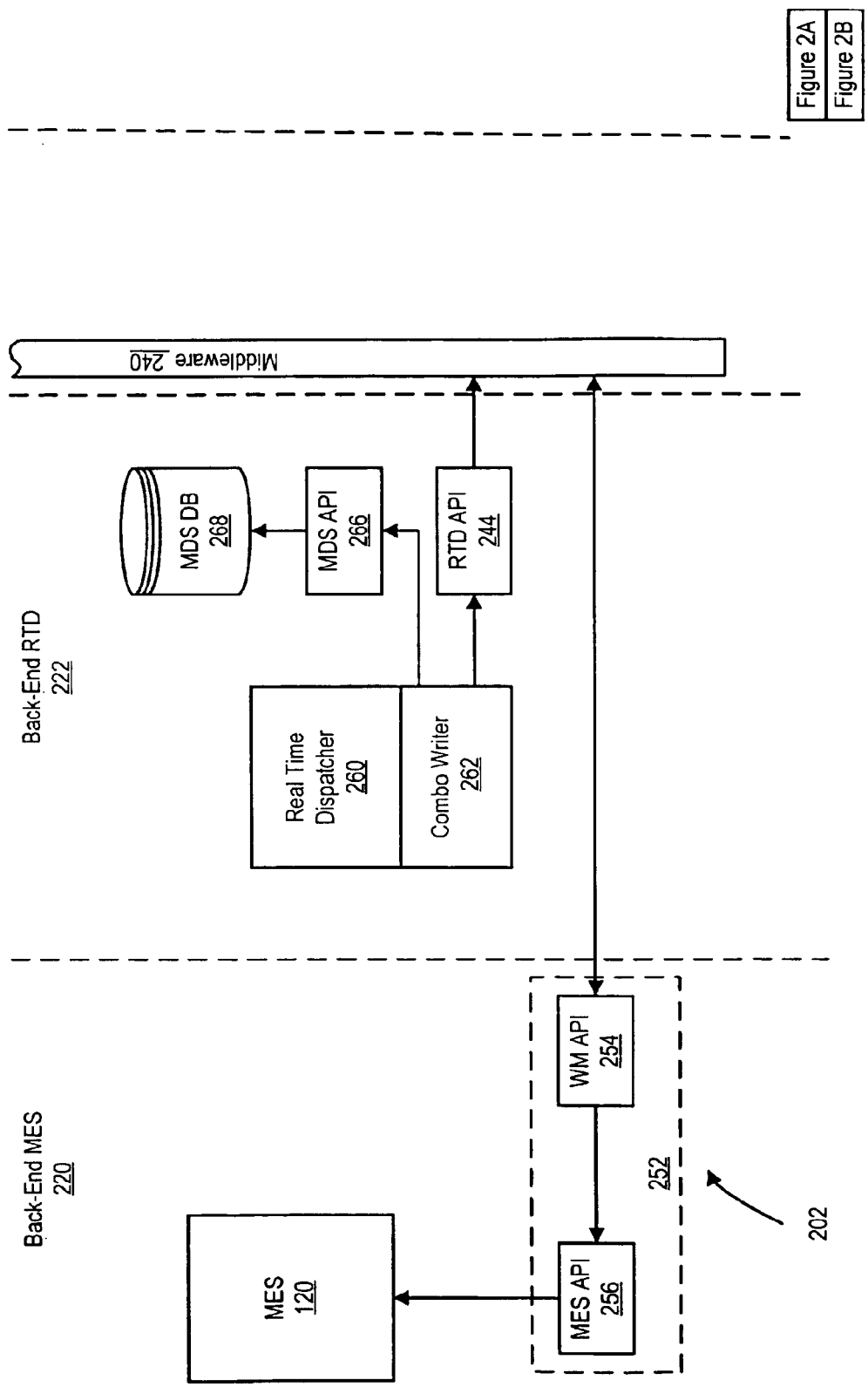

Referring to FIGS. 2A and 2B, a more detailed block diagram of the semiconductor fabrication architecture 100 is shown. More specifically, each individual fabrication facility 110 may be divided into a front end portion 200 and a back end portion 202. The front end portion 200 may be further divided into a front end MES portion 210 and a front end RTD portion 212. The back end portion 202 may be further divided into a back end MES portion 220 and a back end RTD portion 222.

The front end MES portion 210 includes the MES 120 as well as a real time interceptor 230, a primary writer 232, a front end WM API 234. The front end MES 210 also includes a script writer 236 and a transport layer 238. The interceptor 230 intercepts transactions from the MES 120 that occur during and after an extract of information from the MES 120. The primary writer 232 stores extracted and intercepted messages in a message buffer until the messages are transferred to the front end RTD portion 212. The primary writer only keeps a message until the message is successfully communicated to the front end RTD portion 212. The front end WM API 234 has the capabilities to execute remote transactions via the MES API functions.

The front end RTD portion 212 includes a front end real time dispatcher 240, a secondary writer 242 and a front end RTD API 244 as well as an MDS API 246 and an MDS database 248. The front end real time dispatcher 240 prioritizes lot movement based upon predefined roles. The secondary writer 242 requests messages from the primary writer 232. The secondary writer 242 stores the messages that are received in a secondary writer message buffer. The secondary writer 242 then provides the messages received from the primary writer to the middleware component 140 via the RID API 264 under the control of the front end real time dispatcher 240. The messages are also provided to the MDS database 268 via the MDS API 266 under the control of the front end real time dispatcher 240.

The back end MES portion 212 includes the MES 120. The back end MES portion 212 also includes a back end API 252 which includes a back end WM API 254 and a back end MES API 256.

The back end RTD portion 222 includes a back end real time dispatcher 260 as well as a combo writer 262. The back end RTD portion 222 also includes a back end RTD API 264 as well as a back end MDS API 266 and a back end MDS database 268. The combination writer 262 is a combination of a primary writer and a secondary writer. Thus the combination writer 262 receives messages from the $M_{13}$ B database 250 and provides messages to the RTD API 264 as well as to the MDS API 266 under control of the back end real time dispatcher 260.

Figure 3:
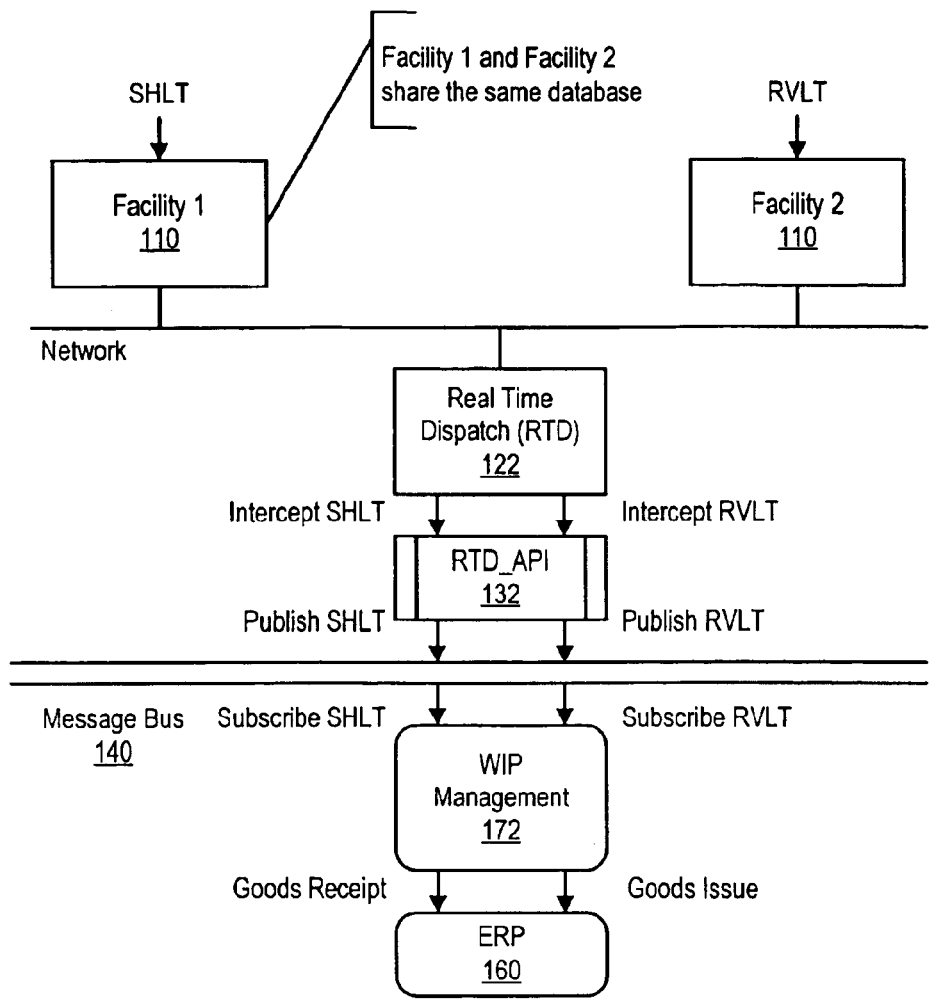
FIG. 3 shows a flow chart of an intrafacility shipping process flow.
Figure 4:
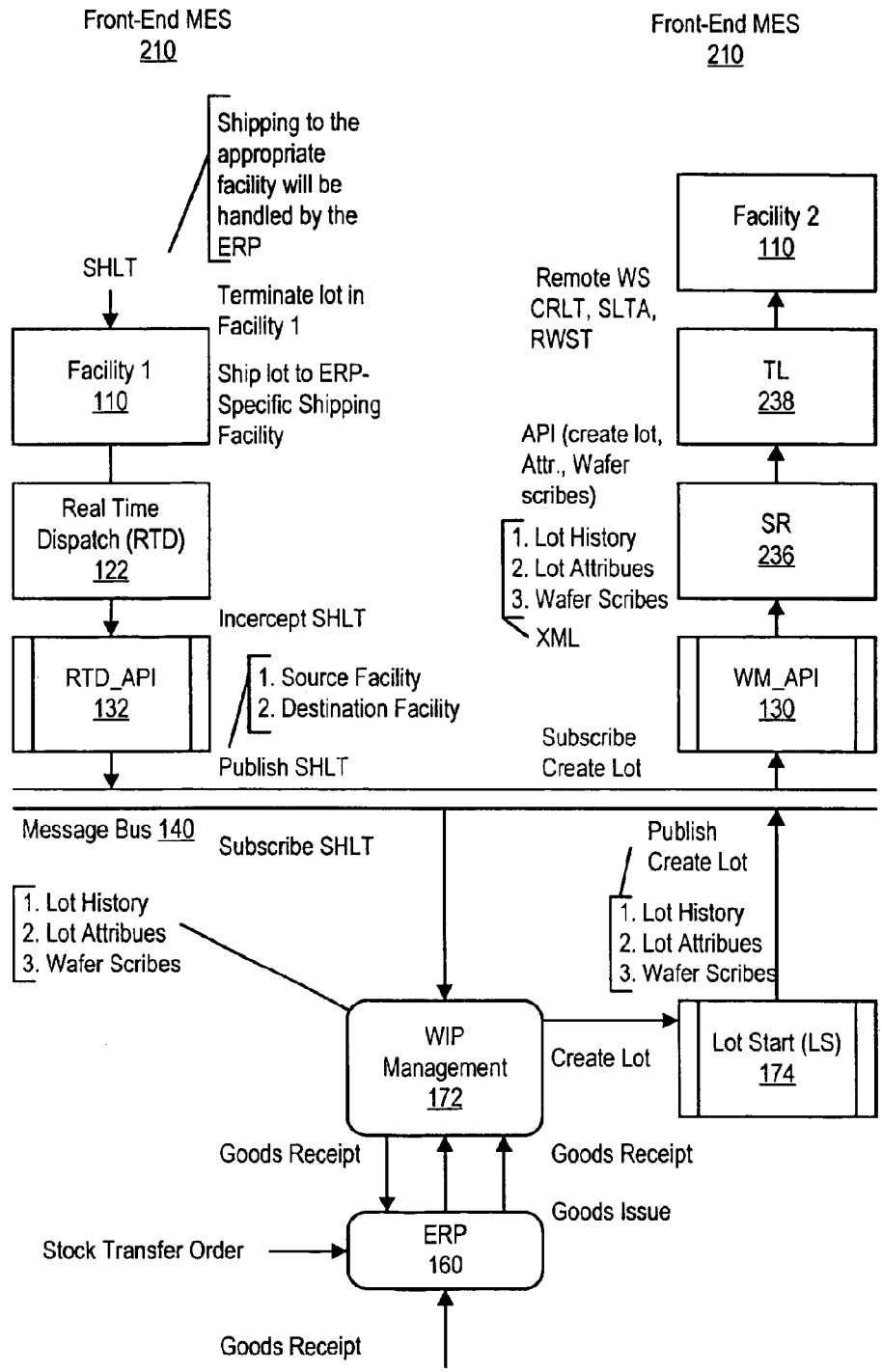
FIG. 4 shows a flow chart of an interfacility shipping process flow.
Figure 5:
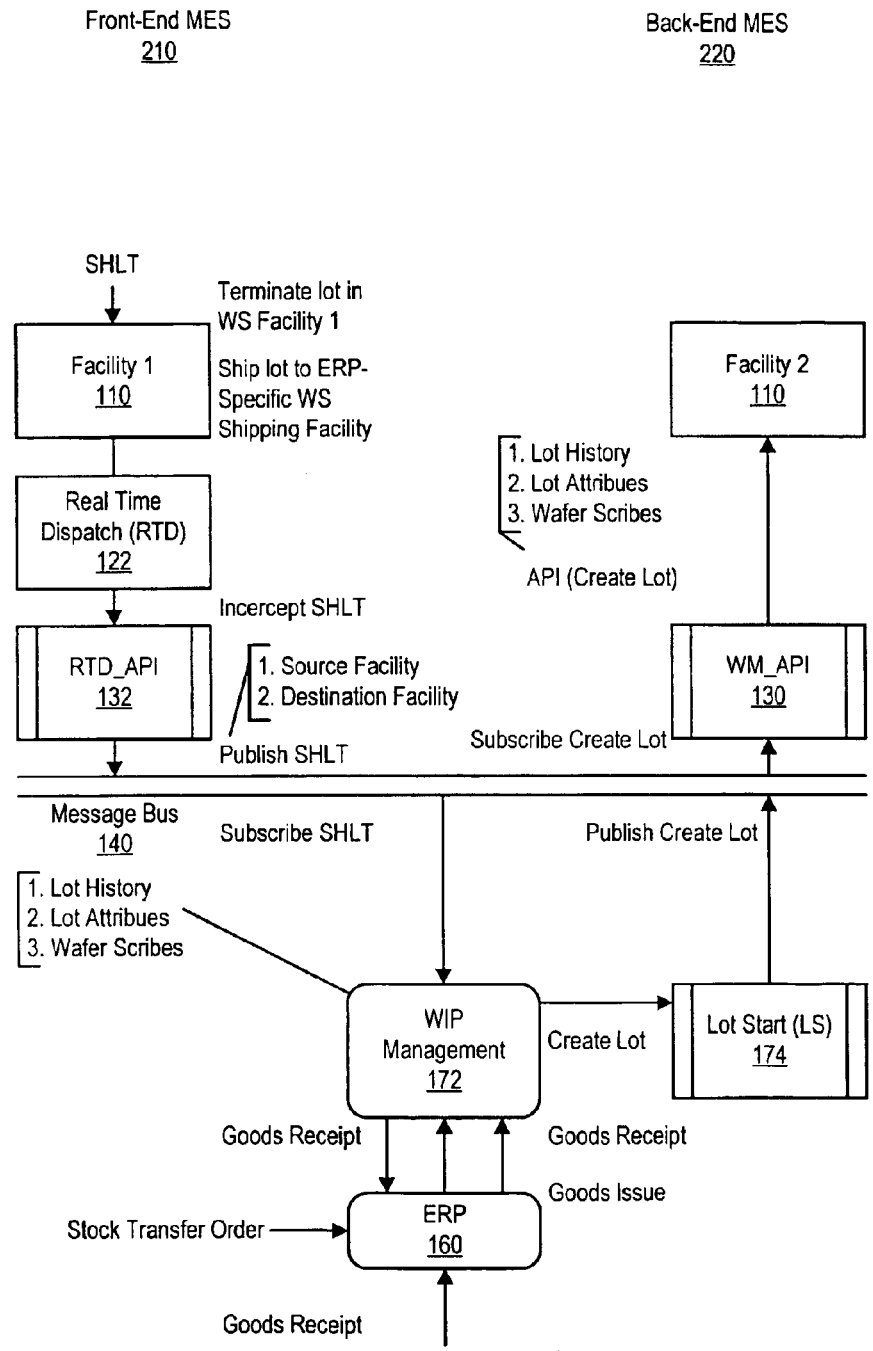
FIG. 5 shows another interfacility shipping process flow.

Referring to FIGS. 3–5, a number of shipping process flows are shown. More specifically, FIG. 3 shows a flow chart of an intrafacility shipping process flow. FIG. 4 shows a flow chart of an interfacility shipping process flow. FIG. 5 shows another interfacility shipping process flow.

With an intrafacility shipping process flow, a lot is shipped from one MES facility 110 to another MES facility 110 that share the same database instance. For example, a lot is shipped from a fabrication portion of the facility 110 to a test portion of the facility or from a fabrication portion of a facility to a bump portion of the facility.

With an interfacility shipping process flow, there are two instances. An interfacility shipping process is invoked when the facilities do not share the same database instance. In one instance, a lot is shipped from one facility that conforms to a particular MES to another facility that conforms to the particular MES. In another instance, a lot is shipped from one facility that conforms to a particular MES to another facility that conforms to another MES.

Referring to FIG. 3, an intrafacility shipping process flow is shown. More specifically, when a lot is shipped from a first facility (facility 1) to another facility (facility 2) a ship lot (SHLT) transaction is initiated. A lot history WIPLTH record containing the SHLT transaction is received by the real time dispatcher 122 and is then intercepted the by RTD API 132. The RTD API 132 converts the record to XML and publishes the record to the middleware message bus 140. The WM API 130 of the facility 2 subscribes to the message and initiates a wafer data upload process. (See FIG. 8). The WIP management system 172 subscribes to the message and updates its database to indicate that the lot has completed in the source facility (facility 1). If attributes associated with the lot were changes, these changes attributes are uploaded to the second facility via the WM API 130 of the second facility. The WIF management system 172 also initiates a goods receipt transaction within the ERP system 160 to place the lot in a storage location for the receiving facility. When the lot is received at the destination facility, a receive lot (RVLT) transaction is initiated by the destination facility. The receive lot transaction is received by the real time dispatcher 122 and is intercepted by the RTD API 132. The RTD API 132 publishes the updated WIPLTH record to the middleware message bus 140. The WIP management system 172 subscribes to the message and initiates a goods issue transaction to update the appropriate fields within the ERP system 160, thus completed the intrafacility shipping process.

Referring to FIG. 4, the process flow for an interfacility shipping process is shown. More specifically, a process flow for when a lot is shipped from one facility that conforms to a particular MES to another facility that conforms to the particular MES is shown. When a lot is shipped from one facility to another facility, a ship lot (SHLT) transaction is initiated. The lot is moved to an ERP specific shipping facility and the lot status is terminated. For example, if the lot is shipped from one fab facility to another bump facility, the lot is removed from the fab facility and placed in a shipping facility, where the status of the lot is terminated. The WIPLTH record containing the SHLT transaction is received the by RTD 122 and intercepted by the RTD API 132. The RTD API 132 converts the record to an XML message and published the record to the middleware message bus 140. The message includes the names of the source and destination facilities. The WM API 130 of the other facility subscribes to the message and initiates a wafer data upload process. (See FIG. 8). The WIP management system 172 subscribes to the message and updates the WM database to indicate that the lot has completed in the source facility. If the attributes associated with the lot were changed, then these attributes are also uploaded. The WM system 172 also initiates a goods receipt transaction to place the lot in an ERP storage location for the destination facility. When the lot is physically shipped, a stock transfer order is completed. Then a goods issue transaction updates the ERP storage location of the lot and the WM system database. When the lot is received at the destination, a goods receipt transaction is issued to the ERP system 160. This initiates a post shipping remote create lot process. Completion of the post shipping remote create lot process completes the interfacility shipping process flow.

Referring to FIG. 5, the process flow for another interfacility shipping process is shown. More specifically, a process flow for when a lot is shipped from one facility that conforms to a particular MES to another facility that conforms to another MES is shown. When a lot is shipped from one facility to another facility, a ship lot (SHLT) transaction is initiated. The lot is moved to an ERP specific shipping facility and the lot status is terminated. For example, if the lot is shipped from one fab facility to another bump facility, the lot is removed from the fab facility and placed in a shipping facility, where the status of the lot is terminated. The WIPLTH record containing the SHLT transaction is received the by RTD 122 and intercepted by the RTD API 132. The RTD API 132 converts the record to an XML message and published the record to the middleware message bus 140. The message includes the names of the source and destination facilities. The WM API 130 of the other facility subscribes to the message and initiates a wafer data upload process. (See FIG. 8). The WIP management system 172 subscribes to the message and updates the WM database to indicate that the lot has completed in the source facility. If the attributes associated with the lot were changed, then these attributes are also uploaded. The WM system 172 also initiates a goods receipt transaction to place the lot in an ERP storage location for the destination facility. When the lot is physically shipped, a stock transfer order is completed. Then a goods issue transaction updates the ERP storage location of the lot and the WM system database. When the lot is received at the destination, a goods receipt transaction is issued to the ERP system 160. This issue initiates a post shipping remote create lot process. Completion of the post shipping remote create lot process completes the interfacility shipping process flow.

Figure 6:
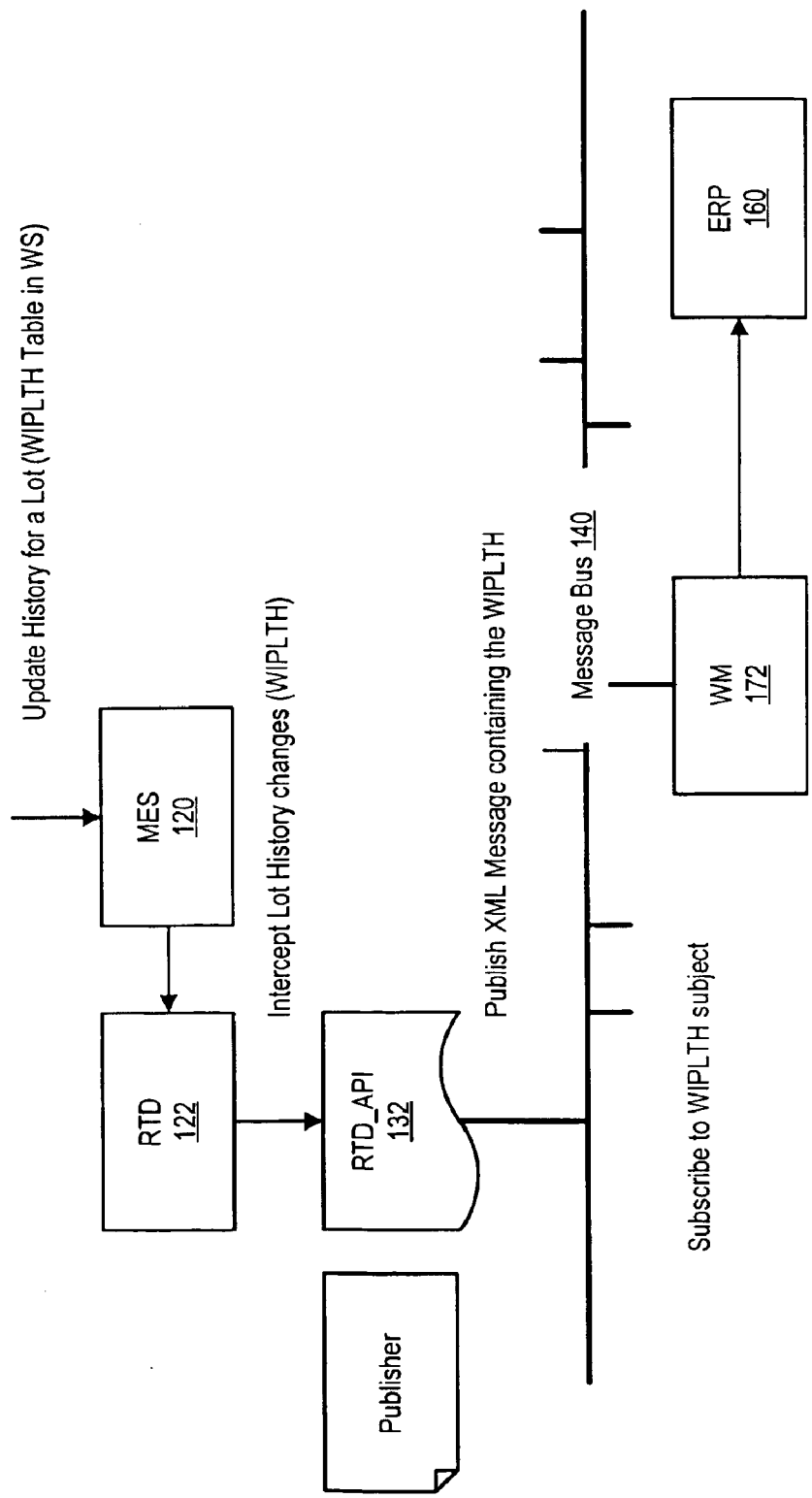
FIG. 6 shows a process flow for a lot history upload.

Referring to FIG. 6, a process flow for a lot history upload is shown. More specifically, the WM system 172 receives and stores all lot history transactions in its database. If a transaction is relevant for costing, then the WM system 172 uploads the pertinent lot history data to the ERP system 160. For example, the WM system 172 uploads pertinent data to the ERP system 160 for move out (MVOU) transactions that occur at reporting points. Likewise, the WM system 172 uploads data for ship lot (SHLT) transactions that indicate movement across bill of material (BOM) levels. However, the actual transactions are not necessarily uploaded to the ERP system 160.

When uploading lot history, a lot based transaction occurs in the facility MES 120 and is written to a WIP Lot History (WIPLTH) table. The RTD API 132 intercepts the lot based transaction via the RTD 122. The RTD API 132 converts the record to an XML message and publishes the message to the message bus 140. The WM system 172 subscribes to the message and updates its database. If the transaction is relevant for costing, the WM system 172 sends the relevant data to the ERP 160. The lot history upload process then completes.

Figure 7:
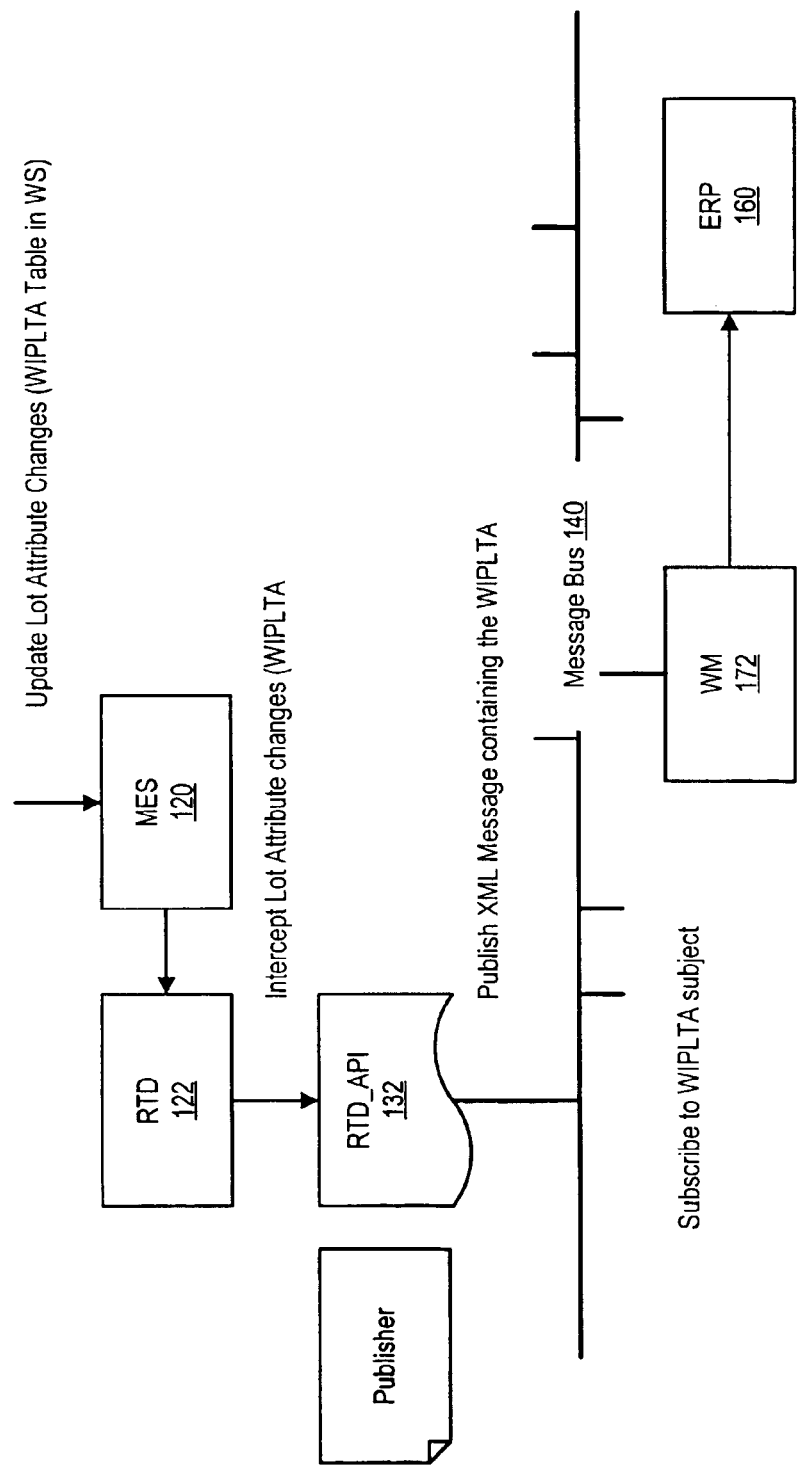
FIG. 7 shows a process flow for a lot attribute upload.

Referring to FIG. 7, a process flow for a lot attribute upload is shown. More specifically, the WM system 172 receives and stores all lot attribute transactions in its database. If a transaction is relevant for the ERP system 160, then the WM system 172 uploads the pertinent lot attribute data to the ERP system 160. However, the actual transactions are not necessarily uploaded to the ERP system 160.

When uploading lot attribute data, a lot attribute is set or changed in the MES 120 via a set lot attribute (SLTA) transaction which in turn updates a WIP lot attribute (WIPLTA) table. The RTD API 132 intercepts the lot attribute transaction via the RTD 122. The RTD API 132 converts the lot attribute transaction record to an XML message and publishes all lot attribute messages to the message bus 140. The WM system 172 subscribes to the message and writes the set lot attribute transaction to its lot history table and updates the value of the attribute in its lot attribute table. If the transaction is relevant to the ERP system 160, then the WM system 172 sends the pertinent data to the ERP system 160. The lot attribute upload process then completes.

Figure 8:
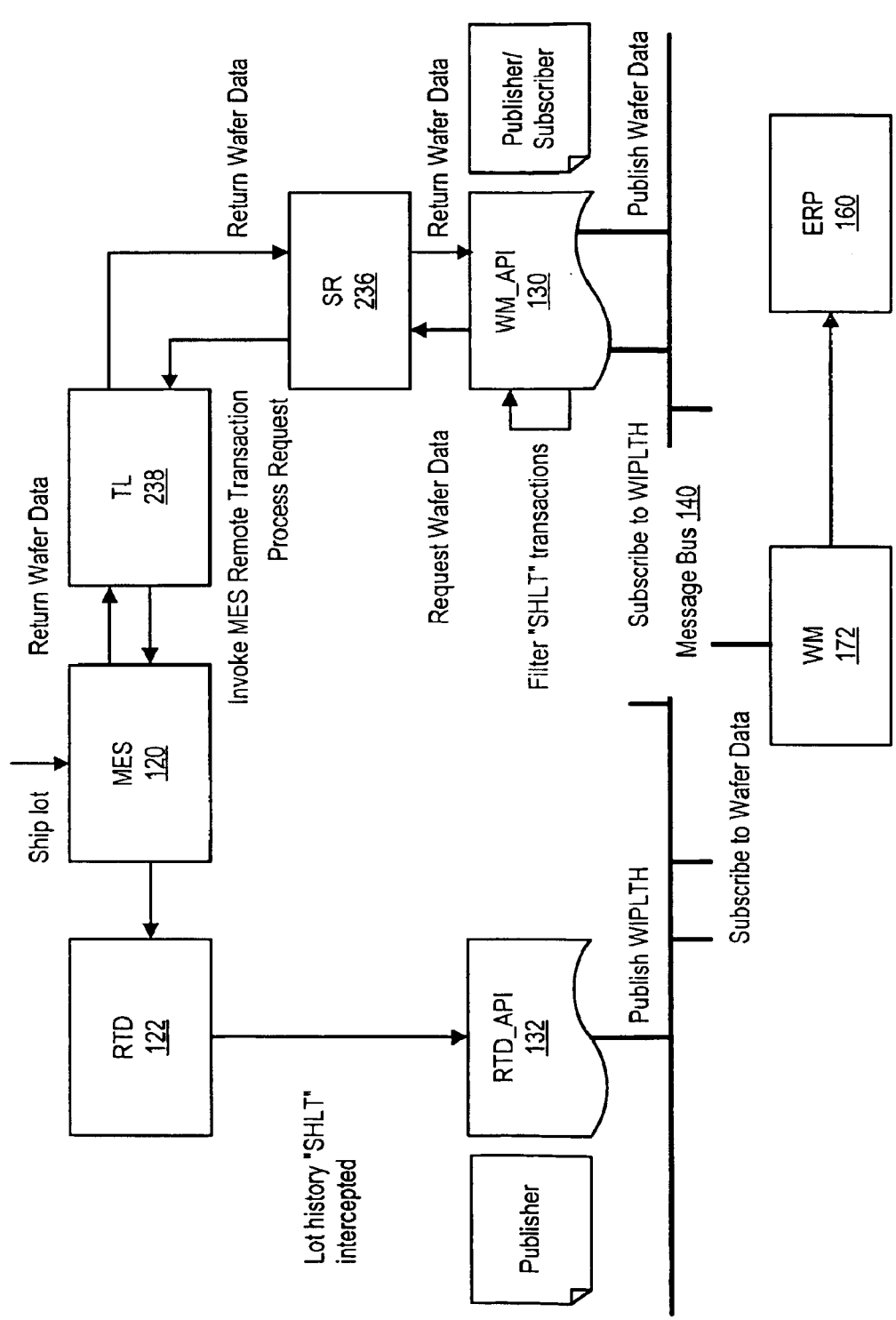
FIG. 8 shows a process flow for a wafer data upload.

Referring to FIG. 8, a process flow for a wafer data upload is shown. More specifically, whenever a lot is shipped from an MES facility 120 (e.g., intrafacility shipping, interfacility shipping), the wafer scribes and virtual wafer identifiers (i.e., the original wafer slot positions) are sent to the WM system 172.

When uploading wafer data, a lot is shipped from an MES facility 120. A ship lot (SHLT) transaction is received the by RTD 122 and intercepted by the RTD API 132. The RTD API 132 publishes the updated WIPLTH record to the message bus 140. This record includes the names of the source and destination facilities. The WM API 130 subscribes to the WIPLTH record and filters the record to identify the SHLT transaction. The WM API 130 then sends a request for wafer scribes and virtual wafer IDs to the MES 120 via the SR Tester 236 and the TL 238. The TL issues a remote MES transaction to obtain the wafer data. The WM API then receives and publishes the wafer data to the message bus 140. The WM system 172 subscribes to the wafer data message and updates its database. The wafer data upload process then completes. The wafer data is not actually sent from the WM system 172 to the ERP system 160, the wafer data is stored in the WM system database until the WM system 172 publishes the data in response to a wafer data request for that lot. The ERP system 160 then subscribes to the published data.

Figure 9:
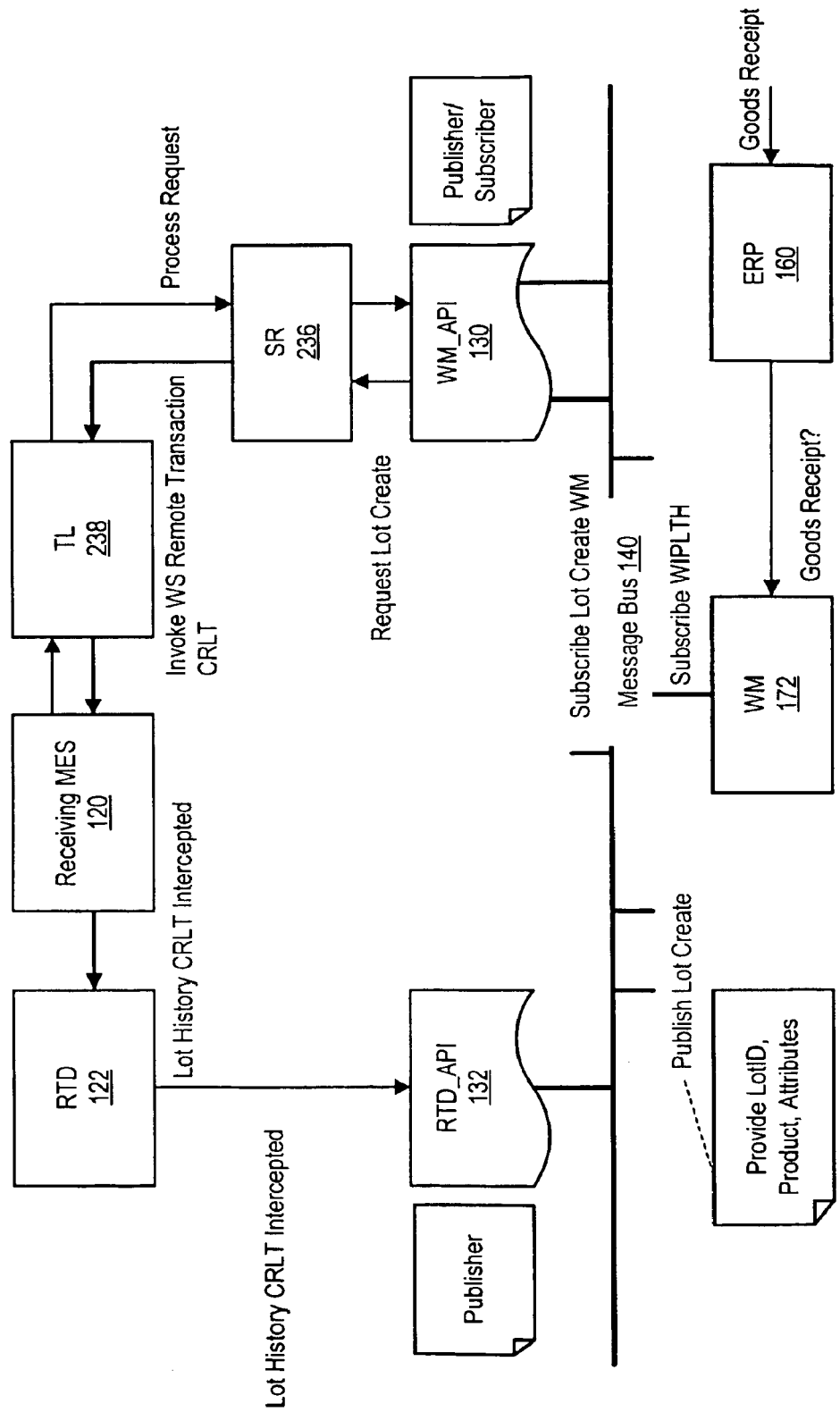
FIG. 9 shows a process flow for a post shipping lot create in a destination facility.

Referring to FIG. 9, a process flow for a post shipping lot create in a destination facility is shown. More specifically, whenever a lot is shipped from one MES facility 120 to another MES facility 120 that does not share the same database instance, then the lot is created in the receiving facility. The process begins when a goods receipt transaction is initiated within the ERP 160. The process completes when the lot is created in the destination facility 120, the lot attributes are copies and the WM database is updated to reflect the new lot location.

When a lot is shipped from an MES facility 120 to another MES facility 120 that does not share the same database instance (e.g., inter-facility shipping of semi-finished goods), a ship lot (SHLT) transaction is initiated. The lot is shipped from the source facility to an ERP specific shipping facility and the lot status is marked as terminated at the shipping facility. When the lot arrives at the destination facility 120, an ERP goods receipt transaction is issued for the lot and published to the message bus 140. The WM system 172 subscribes to the message, updates the lot status information in its database for that lot and publishes the lot ID, the product ID, the operation, the lot quantity, the lot owner a lot indicator and attributes in a lot create message to the message bus 140. The WM API 130 subscribes to the lot create message and sends a request to the MES 120 via the SR Tester 236 and the TL 238. The TL 238 issues a remote create lot transaction. The lot is then created in the destination facility 120 and the lot record WIPLOT, lot history WIPLTH and lot attribute WIPLTA tables of the destination facility are updated with records for the new lot. The WIPLTA table is also populated with attributes associated with the lot in the source facility. The remote create lot transaction is received by the real time dispatcher 122 and intercepted by the RTD API 132. The RTD API publishes the create lot transaction in the WIPLTH record to the message bus 140. The WM system 172 subscribes to the message and updates the lot status in the WM system 172 to reflect the new facility. The process then completes.

Figure 10:
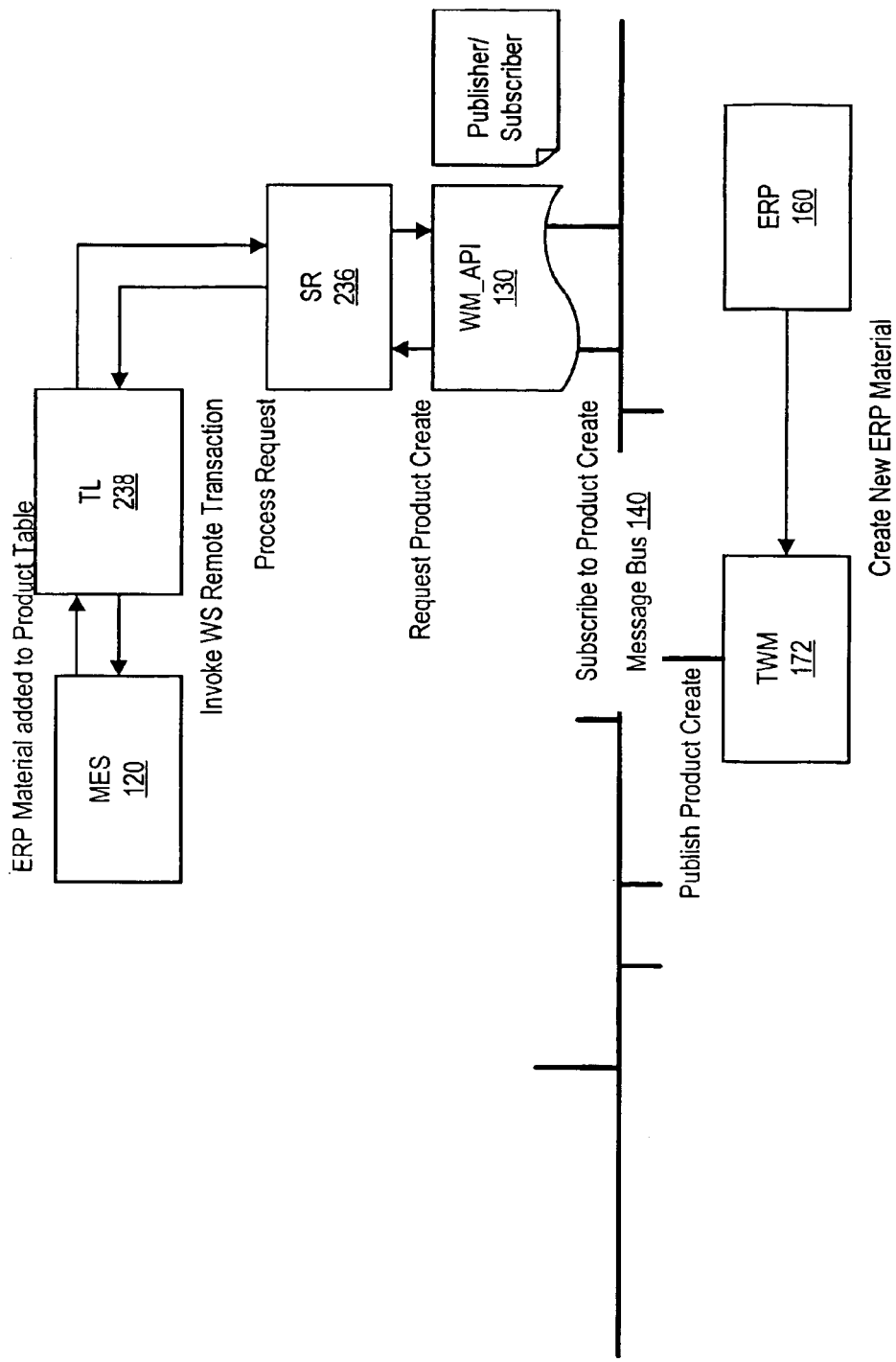
FIG. 10 shows the process flow for creating a product that corresponds to a new ERP material.

Referring to FIG. 10, the process flow for creating a product that corresponds to a new ERP material is shown. More specifically, a new material is created in an ERP message and published to the message bus 140. The WM system 172 subscribes to the message and publishes a product create message to the message bus 140. The WM API 130 subscribes to the message and instructs the MES 120 via the SR tester 236 and the TL 238 to initiate a remote update product transaction (RUPR). The remote update product transaction inserts an ERP material ID into an MES product table of the MES 120. The ERP material ID is used for associated MES routes with ERP materials. This ERP material ID is not used to manufacture lots within the MES 120.

Figure 11:
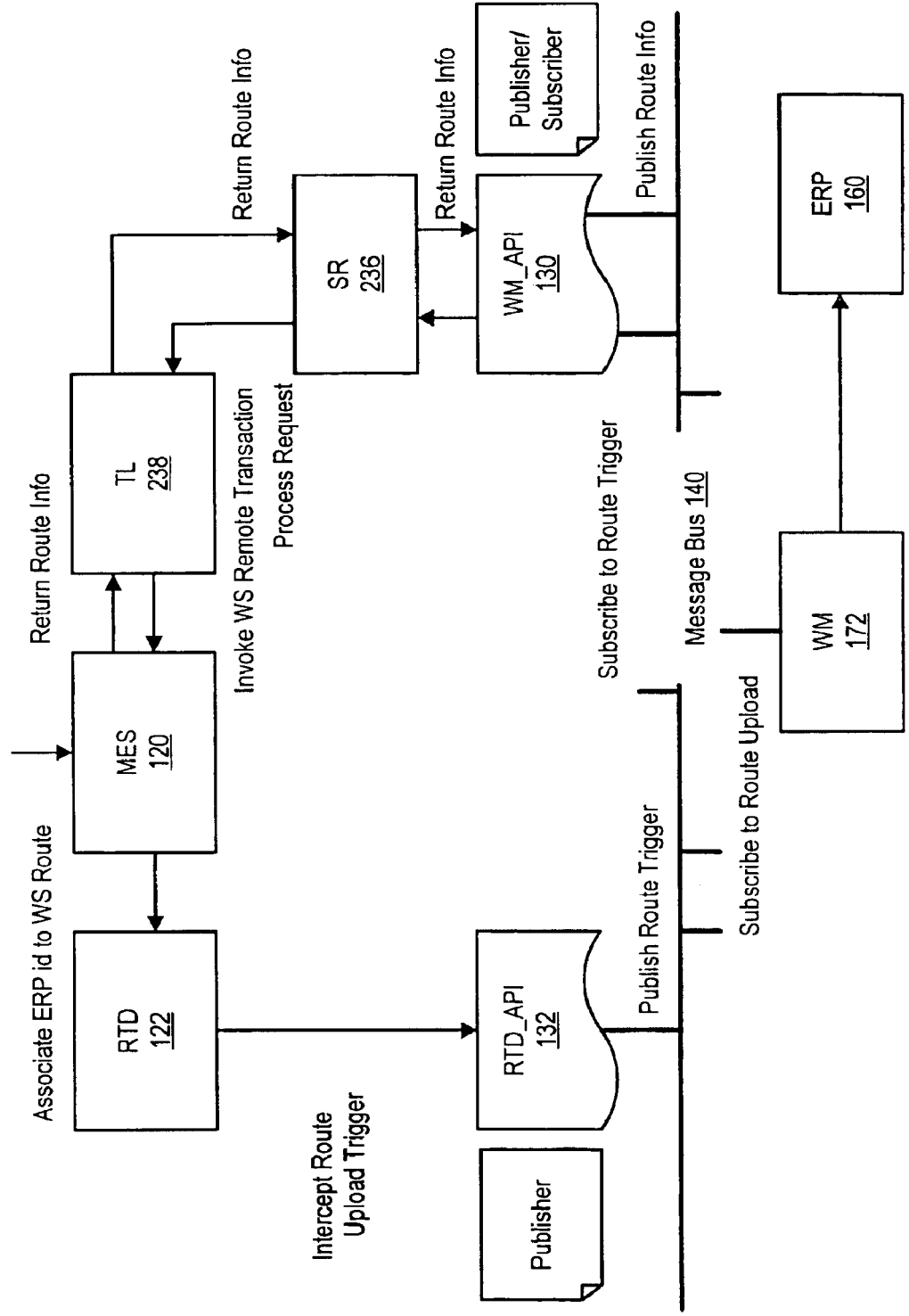
FIG. 11 shows the process flow for associating an MES route to an ERP material.

Referring to FIG. 11, the process flow for associated an MES route to an ERP material is shown. The monetary value of a lot is based in part upon the position of the lot within a manufacturing route. Thus, for the ERP system 160 to accurately cost materials, each ERP material should be associated with a routing that includes reporting points. ERP routings are automatically uploaded from the facility routes. This flow does not address the MES route update or on demand routing updates within the ERP system 160.

An MES administrator is notified that a new product has been created (See, e.g. FIG. 10) or that a route has been modified in a way that impacts the ERP costing and inventory. For a route that has been modified in a way that impacts the ERP costing and inventory, the MES administrator initiates an associate route to product (ARTP) transaction to associate the ERP material to an MES route. The ARTP transaction updates the WIP product description WIPPRD table in the MES 120 to map the route to the new material. When a new product is created (or after the ARTP transaction is initiated), the MES administrator initiates an update product (UPRD) transaction. The update product transaction identifies ERP within a material type field. By submitting an update product with an ERP material type triggers a route upload to the WM system 172. When the route upload occurs, the RTD API 132 receives a WIP product WIPPRD record from the real time dispatcher 122, converts the record to XML and publishes the message to the message bus 140. The WM API 130 subscribes to the message and forward the request to the MES 120 via the SR Tester 236 and the TL 238. The WM API 130 receives the route information, converts the route information to XML and publishes the route information to the message bus 140. The routing information is provided in a plurality of records: a WIPPRD record, which includes a product ID, a facility, and an ERP material ID; a WIP route information (WIPRTE) record, which includes the route name, the route description and a BOM level for the route; the sequence operation steps of the route (WIPRTO) records, which include the route name and operation for every operation on the route; and, WIP operation product (WIPOPR) records, which include the operation number, short and long description, work centers and reporting point indicators for each operation on the route. The WM system 172 subscribes to these messages, populates the relevant WM database tables and uploads the route, operation, BOM levels, work centers and reporting points to the ERP system 160. This completes the route upload process.

Referring again to FIG. 2, the various MES facilities 120 are initialized to correspond to a plurality of ERP related functions. These facilities are initialized to include an ERP material create function, a routing upload function, a product validation at lot crate function, a product mapping function and a shipping facility function.

The material create function is when a new material is created within the ERP system 160, that material is then associates with an MES route. This association enables the ERP system 160 to accurately cost a product based upon the location of the product in the processing stream. Relevant points within the route include the BOM level, the reporting points and the work centers. The MES system 120 passes this information to the ERP system 160. For the BOM level, this information is accomplished via the route. For the reporting points and the work centers, this information is accomplished via the operation.

The BOM level for a lot does not change as long as the lot remains within the same facility 110. Thus the BOM level is associated with an MES route. There are at least three BOM levels, a FAB BOM level (which corresponds to a processed wafer) a BUMP BOM level (which corresponds to a bumped wafer) and a SORT BOM level (which corresponds to a sorted die). When setting up routes with BOM levels, an update user defined facility fields (UUFF) transaction specifies a user defined field as the BOM level field for all routes. The update user route field (UURF) transaction defines the value of the BOM level for each route and the BOM level is defined for each route within a facility.

The work centers and reporting points may vary with each MES operation. Thus two user defined fields are associated with the operations and are used to specify these values. To set up the MES operations with work centers and reporting points, the UUFF transaction is used to specify a user defined field as a work center field and a user defined field as an ERP reporting field for operations. An update user defined operation field (UUOF) transaction is used to define the value of the work center and the reporting point for each operation. If the operation is an ERP reporting point, the value is yes (Y), otherwise the value is no (N). The UUOF transaction is repeated for each operation within a facility.

During lot create, if a product is salable, then a check is performed to confirm that the MES product corresponds to a valid ERP material. To determine whether a product is salable, an update table entry general (UTEG) transaction is used to update a general tables (GTS) owners table to include a salable indicate field. The GTS owners table is updated to specify a value of 1 for owner codes engineering (ENG) and product (PROD) (i.e., salable vs. not salable).

Other Embodiments

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Figure 12A:
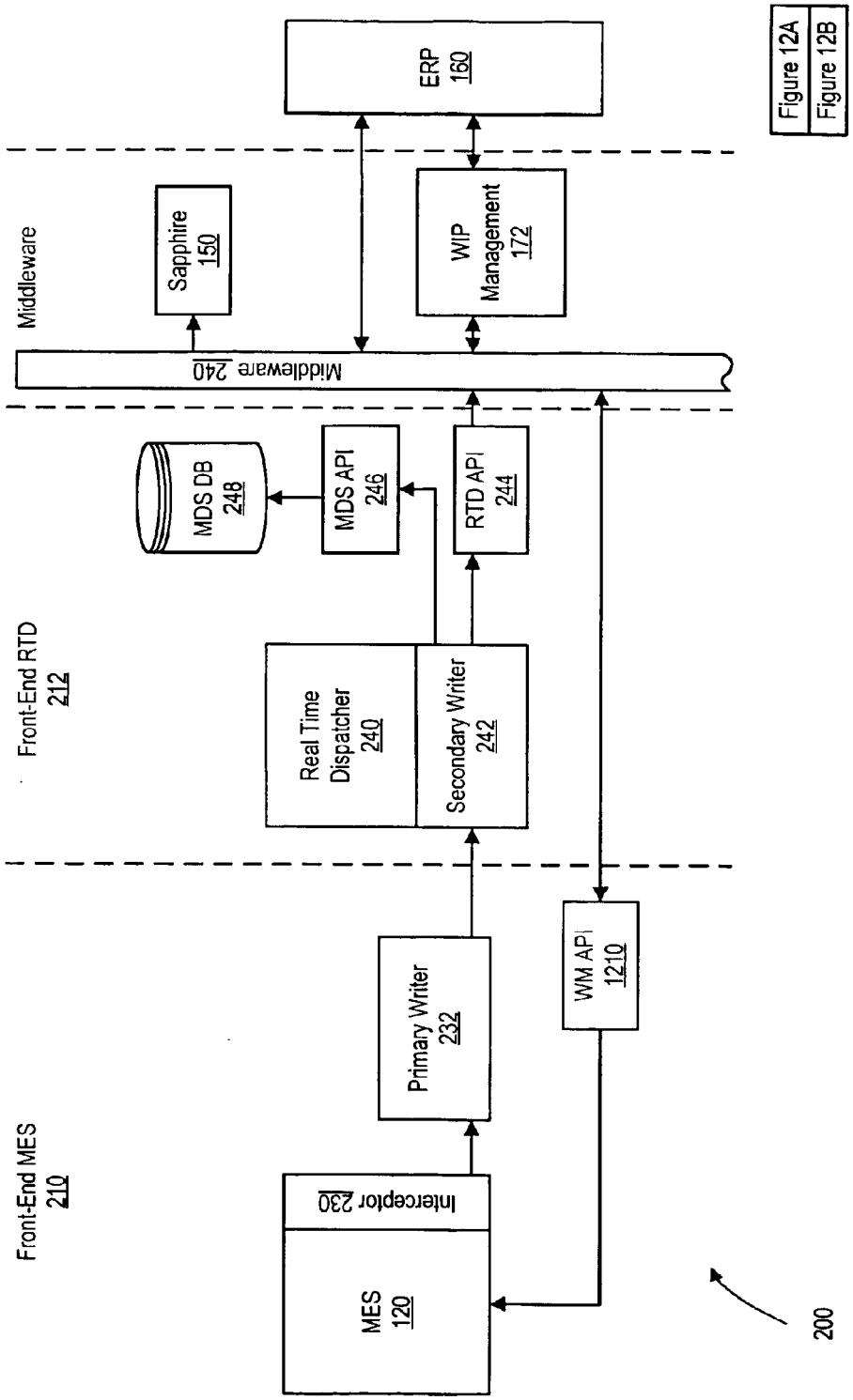
FIGS. 12A and 12B show an alternate fabrication architecture.
Figure 12B:
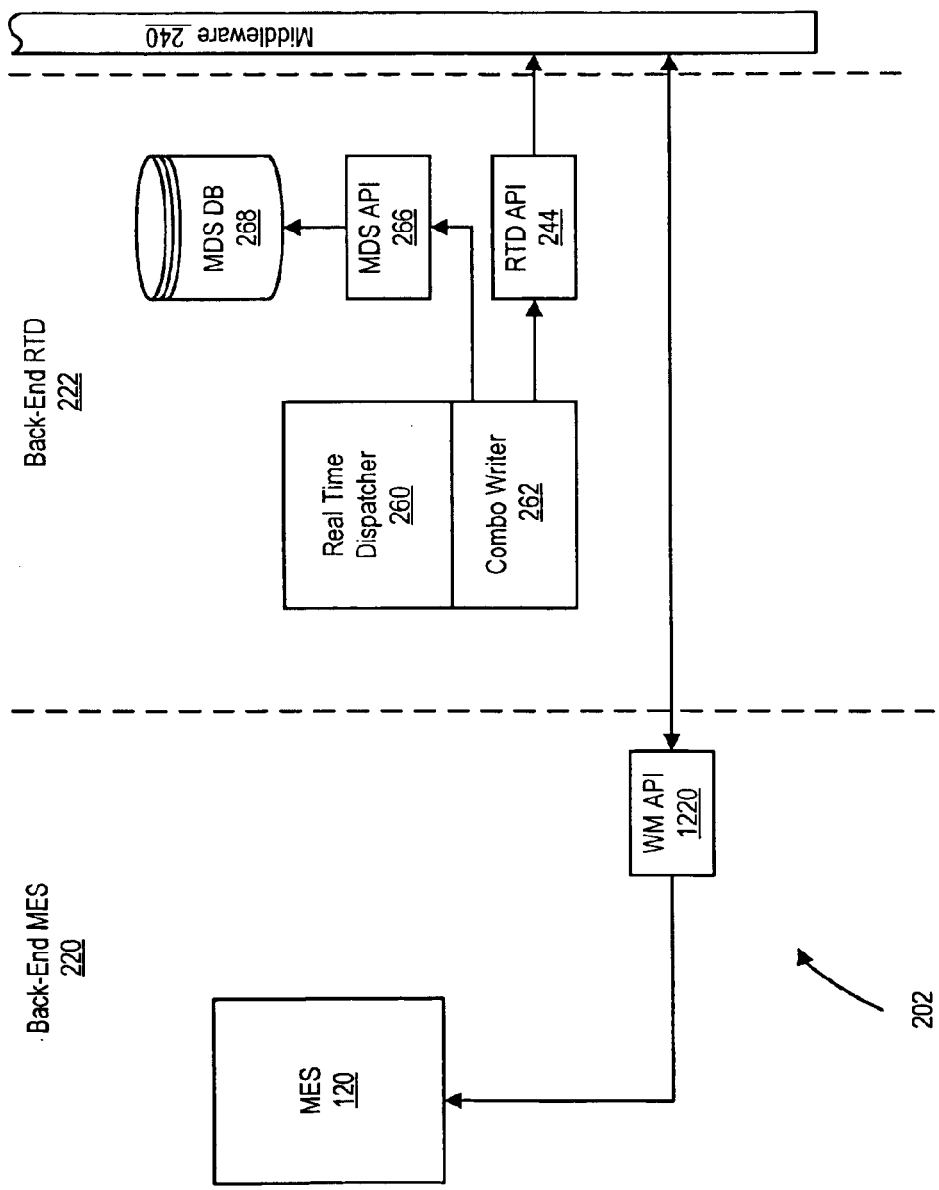

For example, referring to FIGS. 12A and 12B, an alternate fabrication architecture may include front end WM API 1210 and a back end WM API 1220 which are coupled directly to the MES 120.

Also for example, referring again to FIG. 11, an alternate route upload process may be used. In the alternate route upload process an ERP material is created in the ERP system 160. The WM system 170 publishes the ERP material to the middleware component 140. The WM API 130 receives the message and initiates a remote transaction (RSAP) to store the ERP material (referred to as a ERP ID) in an MES database table (called the ERP PRODUCTS database). The association between the ERP ID and the MES product is via a web based product mapping application. With the product mapping application, a user goes to the web based product mapping application and associates the ERP ID with an MES product, routes and other characteristics. Once the mapping association is completed, the user can select from a list of ERP IDs and trigger a route upload from the MES 120 to the ERP 160 for every select ID by actuating a Route Upload button on the product mapping application.

Once triggered, the product mapping application publishes a message for a route upload for the selected ERP ID to the middleware component 140. The message contains the ERP ID and its associated Product. The WM API 130 receives the message and starts the upload process by initiating a remote transaction. Upon completion of the remote transaction, the WM API 130 initiates another remote transaction (RGOR) to obtain all operations for each returned route from the remote transaction. Once the WM API 130 has all of the operations for each route, the WM API 130 publishes all routes and operations for an ERP ID to the middleware component 140. The WM system 170 receives the message and performs the appropriate actions to update its database tables and uploads the route and operations, the BOM and the work center information to the ERP system 160.

Also for example, the above-discussed embodiments include software modules that perform certain tasks. The software modules discussed herein may include script, batch, or other executable files. The software modules may be stored on, a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computerreadable storage media may be used to store the modules discussed herein. Additionally, those skilled in the art will recognize that the separation of functionality into modules is for illustrative purposes. Alternative embodiments may merge the functionality of multiple modules into a single module or may impose an alternate decomposition of functionality of modules. For example, a software module for calling sub-modules may be decomposed so that each sub-module performs its function and passes control directly to another sub-module.

Consequently, the invention is intended to be limited only by the spirit and scope of the appended claims, giving full cognizance to equivalents in all respects.

What is claimed is:

1. An interface for a semiconductor fabrication facility including a real time dispatch system providing near real time information regarding processing of semiconductor wafers and a middleware component, the interface comprising:

a work in progress application program interface coupled between the fabrication facility and the middleware component, the work in progress application program interface providing a common interface for communicating between the fabrication facility and the middleware component.

2. The interface of claim 1 wherein:

the middleware component includes an XML communicator; and, the work in progress application program interface interfaces with the XML communicator of the middleware component.

3. The interface of claim 1 wherein:

the work in progress application program interface subscribes to route update information from the middleware component.

4. The interface of claim 1 wherein:

the work in progress application program interface packages and publishes route operations to the middleware component.

5. The interface of claim 1 wherein:

the work in progress application program interface subscribes to ship transaction information from the middleware component.

6. The interface of claim 1 wherein:

the work in progress application programs interface packages and publishes wafer identifiers associated with ship transactions to the middleware component.

7. The interface of claim 1 wherein:

the work in progress application program interface creates lot information.

8. The interface of claim 1 wherein:

the fabrication facility fabricates semiconductor devices.

9. A method for interfacing between a fabrication facility and a middleware component comprising;

providing a work in progress application program interface coupled between the fabrication facility and the middleware component, the work in progress application program interface providing a common interface for communicating between the fabrication facility and the middleware component; and publishing information from the fabrication facility to the middleware component via the work in progress application program interface; and, subscribing to information from the middleware component via the work in progress application program interface.

10. The method of claim 9 wherein:

the middleware component includes an XML communicator; and, the method further comprises interfacing with the XML communicator of the middleware component via the work in progress application program interface interfaces.

11. The method of claim 9 further comprising:

subscribing to route update information form the middleware component via the work in progress application program interface.

12. The method of claim 9 further comprising:

packaging and publishing route operations to the middleware component via the work in progress application program interface.

13. The method of claim 9 further comprising:

subscribing to ship transaction information from the middleware component via the work in progress application program interface.

14. The method of claim 9 further comprising:

packaging and publishing wafer identifiers associated with ship transactions to the middleware component via the work in progress application program interface.

15. The method of claim 9 further comprising:

creating lot information via the work in progress application program interface.

16. The method of claim 9 wherein:

the fabrication facility fabricate semiconductor devices.

17. An computer readable media encoded with an application for providing an interface for a semiconductor fabrication facility including a real time dispatch system providing near real time information regarding processing of semiconductor wafers and a middleware component, the application comprising:

a work in progress application program interface module coupled between the fabrication facility and the middleware component, the work in progress application program interface module providing a common interface for communicating between the fabrication facility and the middleware component.

18. The application of claim 1 wherein:

the middleware component includes an XML communicator; and, the work in progress application program interface module interfaces with the XML communicator of the middleware component.

19. The application of claim 17 wherein:

the work in progress application program interface module subscribes to route update information from the middle component.

20. The application of claim 17 wherein:

the work in progress application program interface module packages and publishes route operations to the middleware component.

21. The application of claim 17 wherein:

the work in progress application program interface module subscribes to ship transaction information from the middleware component.

22. The application of claim 17 wherein:

the work in progress application program interface module packages and publishes wafer identifiers associated with ship transactions to the middleware component.

23. The application of claim 17 wherein:

the work in progress application program interface module creates lot information.

24. The application of claim 17 wherein:

the fabrication facility fabricates semiconductor devices.

* * * * *